United States Patent
Kastl et al.

(10) Patent No.: US 8,106,565 B2
(45) Date of Patent: Jan. 31, 2012

(54) PIEZOCERAMIC MULTILAYER ACTUATOR WITH STRESS RELIEF SECTIONS AND INSULATION LAYERS IN SECTIONS WITHOUT RELIEF ZONES

(75) Inventors: Harald Johannes Kastl, Fichtelberg (DE); Christian Reichinger, Neutraubling (DE); Carsten Schuh, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 408 days.

(21) Appl. No.: 12/520,888

(22) PCT Filed: Dec. 19, 2007

(86) PCT No.: PCT/EP2007/064250
§ 371 (c)(1),
(2), (4) Date: Jun. 23, 2009

(87) PCT Pub. No.: WO2008/080859
PCT Pub. Date: Jul. 10, 2008

(65) Prior Publication Data
US 2010/0019620 A1    Jan. 28, 2010

(30) Foreign Application Priority Data
Dec. 29, 2006 (DE) .......... 10 2006 062 076

(51) Int. Cl.
*H01L 41/083* (2006.01)
(52) U.S. Cl. .......... 310/328; 310/366; 29/25.35

(58) Field of Classification Search .......... 310/328, 310/366; 29/25.35
See application file for complete search history.

(56) References Cited

U.S. PATENT DOCUMENTS

| | | | |
|---|---|---|---|
| 3,378,704 A * | 4/1968 | Smith et al. | 310/366 |
| 5,438,232 A * | 8/1995 | Inoue et al. | 310/328 |
| 6,943,482 B2 * | 9/2005 | Bindig et al. | 310/328 |
| 7,205,706 B2 * | 4/2007 | Kadotani et al. | 310/365 |
| 7,288,875 B2 * | 10/2007 | Kadotani et al. | 310/328 |
| 7,358,655 B2 | 4/2008 | Ragossnig et al. | |
| 7,420,319 B2 | 9/2008 | Kastl et al. | |
| 7,745,981 B2 * | 6/2010 | Omura et al. | 310/366 |
| 7,851,974 B2 * | 12/2010 | Dollgast et al. | 310/328 |
| 2006/0066178 A1 * | 3/2006 | Lindner et al. | 310/328 |
| 2006/0132002 A1 * | 6/2006 | Boecking | 310/367 |
| 2008/0218029 A1 * | 9/2008 | Dollgast et al. | 310/328 |
| 2009/0200895 A1 * | 8/2009 | Rapp et al. | 310/314 |

FOREIGN PATENT DOCUMENTS

DE        4201937 A1    7/1992
(Continued)

OTHER PUBLICATIONS

International PCT Search Report, PCT/EP2007/064250, 4 pages, Mailed Apr. 2, 2008.

*Primary Examiner* — Jaydi San Martin
(74) *Attorney, Agent, or Firm* — King & Spalding L.L.P.

(57) ABSTRACT

In a piezoelectric multilayer actuator (1) having micromechanical relief zones (30) and an insulation layer (40) as well as in a method for producing said actuator, as a result of the micromechanical relief zones (30), poling cracks are concentrated in these relief regions (30). This makes it possible to provide the sections I, II, III of the multilayer actuator (1) with an insulation layer (40) which only has an extension behavior similar to the multilayer actuator (1) without poling cracks.

20 Claims, 2 Drawing Sheets

FOREIGN PATENT DOCUMENTS

| | | | |
|---|---|---|---|
| DE | 10234787 C1 | 10/2003 | |
| DE | 10307825 A1 | 9/2004 | |
| DE | 102004031402 A1 | 2/2006 | |
| EP | 0485995 A1 | 5/1992 | |
| JP | 2006041279 A | * | 2/2006 |
| JP | 2006286774 A | * | 10/2006 |
| JP | 2006351602 A | * | 12/2006 |
| JP | 2007157849 A | * | 6/2007 |
| JP | 2007227872 A | * | 9/2007 |
| JP | 2008010529 A | * | 1/2008 |
| JP | 2008108990 A | * | 5/2008 |
| JP | 2008244458 A | * | 10/2008 |
| JP | 2009206109 A | * | 9/2009 |
| JP | 2009267114 A | * | 11/2009 |
| JP | 2011049352 A | * | 3/2011 |

* cited by examiner

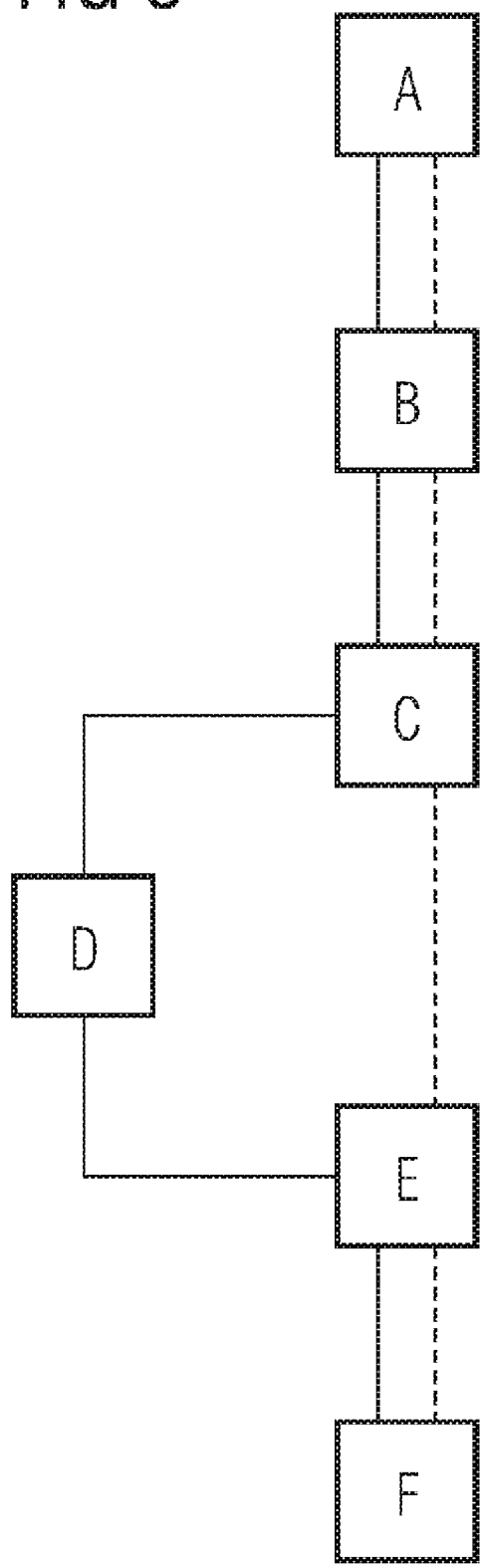

PIEZOCERAMIC MULTILAYER ACTUATOR WITH STRESS RELIEF SECTIONS AND INSULATION LAYERS IN SECTIONS WITHOUT RELIEF ZONES

CROSS-REFERENCE TO RELATED APPLICATIONS

This application is a U.S. National Stage Application of International Application No. PCT/EP2007/064250 filed Dec. 19, 2007, which designates the United States of America, and claims priority to German Application No. 10 2006 062 076.3 filed Dec. 29, 2006, the contents of which are hereby incorporated by reference in their entirety.

TECHNICAL FIELD

The present invention relates to a piezoceramic multilayer actuator and a method for its production.

BACKGROUND

Piezoceramic multilayer actuators, which are also referred to as multilayer stacks, are stacked layer structures, having alternating layers of piezoceramic and internal electrode material. In this structure the internal electrodes reach to the side faces of the multilayer actuator, to achieve the biggest possible active volume in the piezoceramic layers per structural volume of the multilayer actuator.

However if the internal electrodes reach to the outsides of the multilayer actuator, multilayer actuators with such a structure cannot be operated directly in electrically conducting fluids or gases. These fluids or gases would result in an electrical short circuit of the different internal electrodes and thus to failure of the multilayer actuator. This is specifically disadvantageous when the piezoceramic multilayer actuators are used in fuels of internal combustion engines, as for example in direct injection systems in the automotive field. These fuels generally contain certain proportions of water or additives, which would produce an electrical short circuit between internal electrodes projecting to the outside. The same disadvantage results with use in an environment with high air humidity, for example when the multilayer actuator is used in pneumatic valves or as a mass flow controller. Electrical passivation or insulation of the piezoceramic multilayer actuator from the medium surrounding it is therefore essential.

However the material for passivating the multilayer actuator has to have a similar extension capacity to the multilayer actuator itself. The achievable homogeneous extension of the multilayer actuator is up to 0.2% of its length. However if poling cracks occur in certain regions in the piezoceramic multilayer actuator, for example in inactive contacting zones, considerably greater relative extensions of the multilayer actuator are achieved in these regions compared with its homogenous extension. Therefore a coating material used to passivate the multilayer actuator would generally have to have a cyclical mechanical long-term extensibility in the order of magnitude of more than 10%. If such a passivation is utilized for example in a direct injection system in the automotive field, the material also has to have temperature stability up to approximately 180° C. Only silicone elastomers satisfy these material requirements but they are insufficiently resistant in fuels and demonstrate high steam permeability.

One solution deployed in the prior art to protect the piezoceramic multilayer actuator utilizes encapsulation of said piezoceramic multilayer actuator from its environment. This encapsulation consists of a hermetically sealed metallic housing, which does not impede the useful extension of the piezoceramic multilayer actuator. Such an encapsulation is also referred to as an extension pipe or corrugated pipe. These encapsulation solutions are however costly and it has also not been able to realize them to date for higher ambient pressures.

SUMMARY

According to various embodiments, a piezoceramic multilayer actuator and a method for its production can be provided, which can also be deployed in fuels in internal combustion engines even at high pressure and in other ambient conditions that are not favorable for piezoceramic multilayer actuators, for example high air humidity.

According to an embodiment, a piezoceramic multilayer actuator may having the following features: a number of piezoceramic layers and a number of electrodes, which are disposed one above the other in a stacking direction, so that the electrodes are located on opposing sides of the piezoceramic layers, at least one micromechanical relief zone, within which mechanical stresses in the piezoceramic multilayer actuator can be reduced, while a number of sections of the piezoceramic multilayer actuator without a micromechanical relief zone have an insulation layer, so that the section of the piezoceramic multilayer actuator is electrically, chemically and/or thermally insulated from a medium surrounding the piezoceramic multilayer actuator.

According to a further embodiment, the insulation layer may only extend over sections of the piezoceramic multilayer actuator without a micromechanical relief zone. According to a further embodiment, the insulation layer may be a passivation layer, which can be applied before a multilayer actuator green body is sintered or the piezoceramic multilayer actuator is heat-treated. According to a further embodiment, the insulation layer of which may consist of glass, ceramic or a sinterable material, the extensibility and/or thermal expansion coefficient of which corresponds approximately to that of the piezoceramic multilayer actuator. According to a further embodiment, the insulation layer may be a passivation layer, which can be applied after the piezoceramic multilayer actuator has been sintered. According to a further embodiment, the insulation layer of which may consist of a plastic or polymer. According to a further embodiment, a piezoelectrically inactive region may be provided adjacent to a surrounding medium to form the insulation layer. According to a further embodiment, the electrodes may each be configured with a smaller surface than the piezoceramic layers so that the piezoceramic layers each have a piezoelectrically inactive peripheral region. According to a further embodiment, the electrodes of which each may have contacting section, which leads to an outer edge of a piezoceramic layer, so that the electrodes can be contacted electrically from outside the piezoceramic multilayer actuator.

According to another embodiment, a production method for a piezoceramic multilayer actuator, may have the following steps: provision of a number of piezoceramic green films and application of electrodes to at least one side of the piezoceramic green film, arrangement of the piezoceramic green films with electrodes one above the other in a stacking direction to form a stack and sintering of the stack, while at least one material layer is disposed within the stack, which forms a micromechanical relief zone after sintering, and production of an insulation layer adjacent to a medium surrounding the piezoceramic multilayer actuator in sections of the piezoceramic multilayer actuator without a micromechanical relief zone, so that the piezoceramic multilayer actuator is electrically, chemically and/or thermally insulated from the outside.

According to a further embodiment, after sintering in a section of the piezoceramic multilayer actuator that contains no micromechanical relief zone, an insulation layer may be applied to an outer surface of the piezoceramic multilayer actuator parallel to the stacking direction. According to a further embodiment, the passivation layer of which may consist of plastic or a polymer. According to a further embodiment, before sintering in a section of the piezoceramic multilayer actuator that contains no micromechanical relief zone after sintering, a layer, in particular a ceramic-type layer, can be applied to an outer surface of the piezoceramic multilayer actuator parallel to the stacking direction, from which a passivation layer is formed when the piezoceramic multilayer actuator is sintered or heat-treated. According to a further embodiment, the passivation layer of which may consist of glass, ceramic or a material that has an extension capacity and/or thermal expansion coefficient that corresponds approximately to the piezoceramic multilayer actuator. According to a further embodiment, the insulation layer may be formed by forming inactive regions in a peripheral region of the piezoceramic multilayer actuator parallel to the stacking direction, in such a manner that a surface of the electrodes is configured smaller than a surface of the adjacent piezoceramic green films.

BRIEF DESCRIPTION OF THE DRAWINGS

The present invention is described in more detail below with reference to the accompanying drawing, in which:

FIG. 2B shows a section through a piezoceramic multilayer actuator with piezoelectrically inactive peripheral regions perpendicular to the stacking direction and FIG. 3 shows a flow diagram to describe preferred production methods for the piezoceramic multilayer actuator according to various embodiments.

DETAILED DESCRIPTION

Figure 1:
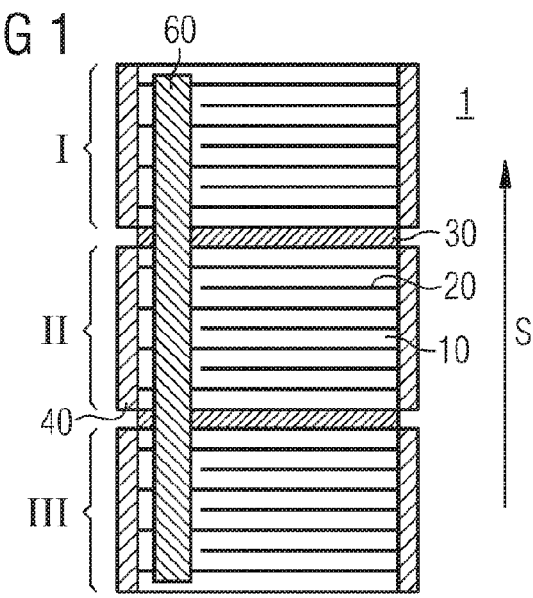
FIG. 1 shows a schematic diagram of a piezoceramic multilayer actuator with an insulation layer applied to the outside of the multilayer actuator.

The piezoceramic multilayer actuator has the following features: a number of piezoceramic layers and a number of electrodes, which are disposed one above the other in a stacking direction, so that the electrodes are located on opposing sides of the piezoceramic layers, at least one micromechanical relief zone, within which mechanical stresses in the piezoceramic multilayer actuator can be reduced, while a number of sections of the piezoceramic multilayer actuator without a micromechanical relief zone have an insulation layer, so that the respective section of the piezoceramic multilayer actuator is electrically, chemically and/or thermally insulated from a medium surrounding the piezoceramic multilayer actuator.

The various embodiments are based on a piezoceramic multilayer actuator with intrinsic safety structures, referred to here as relief zones. These relief zones are formed by ceramic layers or electrodes, which predetermine a local region for the occurrence of poling cracks in the piezoceramic multilayer actuator. This means that poling cracks during the operation of the multilayer actuator only occur in the predetermined regions of these micromechanical relief zones. No poling cracks occur in the sections of the piezoceramic multilayer actuator without a relief zone disposed adjacent to said micromechanical relief zones so that when the piezoceramic multilayer actuator is actuated electrically, the homogeneous extension of approximately 0.2% is not exceeded in these sections. Since the micromechanical relief zones are only configured as mechanical structural components and do not perform an electrical function in the piezoceramic multilayer actuator, the electrical functionality of the multilayer actuator is not adversely affected by the poling cracks occurring in these relief zones, even when no insulation layer is applied in these regions.

The structure described above means therefore that it is possible to apply an insulation layer of glass, ceramic or a sinterable material to the sections without a micromechanical relief zone, the extensibility of said insulation layer corresponding to the homogeneous extension of the piezoceramic multilayer actuator and/or the thermal expansion coefficient of said insulation layer corresponding approximately to that of the multilayer actuator. Since the micromechanical relief zones within the multilayer actuator prevent extension loads above the homogeneous extension of the multilayer actuator in the insulation layer, since this is only applied in the sections without a micromechanical relief zone, the insulation layer can be made from materials, which hitherto could not be used because of the poling cracks that occurred and the correspondingly high level of extension. As well as using glass and/or ceramic to produce the insulation layer it is also possible to use plastics or polymers for insulation purposes.

According to an embodiment the insulation layer is not produced by means of a material to be additionally applied to the outside of the piezoceramic multilayer actuator. Instead piezoelectrically inactive regions are produced in the multilayer actuator parallel to the stacking direction of the piezoceramic multilayer actuator and adjacent to a surrounding medium, to form the insulation layer. This piezoelectrically inactive region, also referred to as a piezoelectrically inactive peripheral region, results from the use of electrodes within the structure of the piezoceramic multilayer actuator, which are each configured with a smaller surface than the adjacent piezoceramic layers. Since the micromechanical relief zones suppress the mechanical stresses within the multilayer actuator, these piezoelectrically inactive peripheral regions are not destroyed by poling cracks so that they are able to carry out their function of insulation layer from surrounding media.

The production method for the piezoceramic multilayer actuator described above has the following steps:
provision of a number of piezoceramic green films and application of electrodes to at least one side of the piezoceramic green film, arrangement of the piezoceramic green films with electrodes one above the other in a stacking direction to form a stack and sintering of the stack, while at least one material layer is disposed within the stack, which forms a micromechanical relief zone after sintering, and production of an insulation layer adjacent to a medium surrounding the piezoceramic multilayer actuator in sections of the piezoceramic multilayer actuator without a micromechanical relief zone, so that the piezoceramic multilayer actuator is electrically, chemically and/or thermally insulated from the outside.

A piezoceramic multilayer actuator 1 is disclosed, of which two different embodiments are shown in FIGS. 1 and 2. The piezoceramic multilayer actuator 1 consists of an alternating arrangement of a number of piezoceramic layers 10 and a number of electrodes 20. These are disposed one above the other in a stacking direction S.

According to the embodiment shown in FIG. 1 the electrodes 20 are configured to cover the whole surface of the adjacent piezoceramic layers 10. Apart from a region in proximity to an external electrode 60 the electrodes 20 thus extend over the entire surface of the adjacent piezoceramic layers 10.

The piezoceramic multilayer actuator is divided into different sections I, II, III or substacks, while the boundary surface of adjacent sections I, II, III is formed by a micromechanical relief zone. The micromechanical relief zone 30 extends over the entire cross-section of the piezoceramic multilayer actuator 1. It is configured in such a manner that it absorbs and relieves mechanical stresses within the piezoceramic multilayer actuator 1, as these would otherwise lead to the formation of damaging cracks in the sections I, II, III of the piezoceramic multilayer actuator 1. Mechanical stresses of this order of magnitude occur for example when poling the piezoceramic multilayer actuator 1, resulting in the formation of poling cracks. The use of micromechanical relief zones 30 means that poling cracks do not occur within the sections I, II, III of the piezoceramic multilayer actuator 1, so the functionality of the piezoceramic multilayer actuator 1 is not adversely affected.

According to one embodiment the micromechanical relief zones 30 consist of a porous, electrically non-conducting ceramic layer, as described in DE 102 34 787 C1. The structure of this porous ceramic layer offers a reduced tensile strength compared with the sections I, II, III of the piezoceramic multilayer actuator 1 parallel to the stacking direction S, which favors crack propagation in the micromechanical relief zone 30. According to a further alternative the micromechanical relief zone 30, which is also referred to as a rupture point, is formed by an electrode layer. Its composition means that this electrode layer delaminates in the event of critical tensile stress parallel to the stacking direction S within the piezoceramic multilayer actuator 1. This is described in DE 10 2004 031 402 A1.

Use of the micromechanical relief zones 30 causes poling cracks only to be formed in the predetermined regions of these relief zones 30 during operation of the piezoceramic multilayer actuator 1. Since the poling cracks formed in the relief zones 30 are not subject to a load from an electrical field—a relief zone 30 represents a region of equal electrical potential—and there is no branching of cracks in the direction of the stacking direction S, in other words in the direction of internal electrodes of different electrical potential, the penetration of electrically conductive fluids or gases is non-critical for the function and service life of the piezoceramic multilayer actuator 1.

No poling cracks result in the sections I, II, III of the piezoceramic multilayer actuator 1 adjacent to the micromechanical relief zones 30, so that the homogeneous extension of approximately 0.2% occurring in these sections I, II, III is not exceeded in the contacting and surface region during operation of the piezoceramic multilayer actuator 1. On this structural basis an insulation layer 40; 50 is produced in the sections I, II, III to insulate the piezoceramic multilayer actuator 1 electrically, chemically and/or thermally from a surrounding medium. This insulation layer 40, 50 must only have an extension capacity in the region of the homogeneous and dynamic extension of the piezoceramic multilayer actuator 1 without failure. It is also preferred for the insulation layer 40, 50 to have a thermal expansion coefficient in the order of magnitude of the thermal expansion coefficient of the piezoceramic multilayer actuator 1. While it is preferred to produce the insulation layer 40 only in the sections I, II, III respectively, it is also possible to apply it in the external regions of the relief zones 30.

According to the first embodiment of the piezoceramic multilayer actuator 1 the insulation layer 40 consists of a thin polymer, glass-type or ceramic passivation layer applied to the electrically active surface of the piezoceramic multilayer actuator 1. This ensures the electrical insulation of the piezoceramic multilayer actuator 1 from the environment, withstands homogeneous reversible and dynamic extensions occurring in the region of up to approximately 0.5% without destruction during poling and during operation of the piezoceramic multilayer actuator 1 and demonstrates reliable adhesion to the surface of the piezoceramic multilayer actuator 10 without delamination.

If the insulation layer 40 is also applied in the region of the micromechanical relief zone 30, the high relative extensions occurring here during poling and operation of the piezoceramic multilayer actuator 1 cause cracks to be initiated in the insulation layer 40 as soon as the maximum extensibility of the insulation layer 40 is exceeded. However as long as the adhesion of the insulation layer 40 to the outer surface of the multilayer actuator 1 is maintained in the region of the edges of the poling cracks, and no delamination occurs, this should be deemed as non-critical for the service life of the piezoceramic multilayer actuator 1.

It is also preferred for the insulation layer 40 to be applied in parallel with known production steps of the piezoceramic multilayer actuator 1. Thus for example a ceramic insulation layer 40 is applied to the outside of the respective section I, II, III or of the entire piezoceramic multilayer actuator 1 before the green body of the piezoceramic multilayer actuator 1 is sintered, and is then produced during sintering.

According to further alternatives the insulation layer 40 consists of plastic or polymer. It is also preferred for mechanically stable plastics or polymers to be used here, which have a similar extension capacity to the sections I, II, III without poling cracks.

Figure 2A:
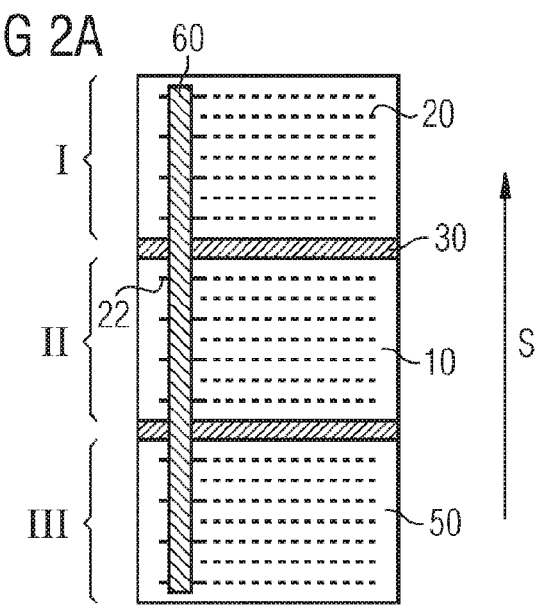
FIG. 2A shows a schematic diagram of a piezoceramic multilayer actuator with piezoelectrically inactive peripheral regions as the insulation layer.
Figure 2B:
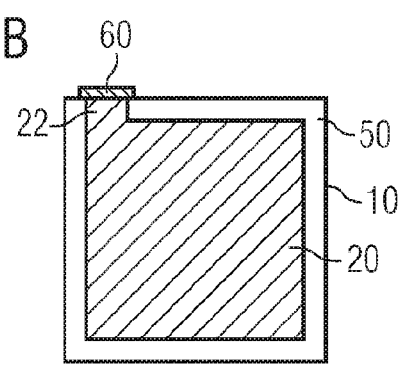

FIG. 2 shows a further embodiment of the piezoceramic multilayer actuator 1. Components of the piezoceramic multilayer actuator 1 that are functionally identical to those shown in FIG. 1 are identified with the same reference characters. In contrast to the embodiment in FIG. 1 the insulation layer 50 in FIG. 2 is produced by appropriate selection of the area of the electrodes 20 compared with the area of the adjacent piezoceramic layers 10. As shown in FIGS. 2A and 2B, the electrode 20 has a smaller area than the adjacent piezoceramic layer 10. In this manner an inactive region is formed in the peripheral region of the piezoceramic multilayer actuator 1 parallel to the stacking direction S, to insulate and shield the piezoceramic multilayer actuator 1 from the surrounding medium. Since poling cracks only form in the micromechanical relief zones 30, the piezoelectrically inactive insulation layer 50 provides a closed "envelope" for the piezoelectrically active region of the multilayer actuator 1.

The electrodes 20 have a contacting section 22, which leads to the outside of the piezoceramic multilayer actuator 1 (see also FIG. 2B). The contacting section 22 is connected there to an external electrode 60, in order to be able to actuate the piezoceramic multilayer actuator 1 electrically.

Possible production methods for the piezoceramic multilayer actuator 1 are shown schematically in FIG. 3. According to a first method alternative the steps connected to one another by means of a continuous line are executed. Firstly in step A a number of piezoceramic green films are provided, to which electrodes are then applied on at least one side in step B. Then in step C piezoceramic green films with electrodes are disposed one above the other in a stacking direction S to form a stack. This stack also comprises at least one material layer, which forms a micromechanical relief zone 30 after sintering. Before the stack is sintered (step E), the outsides of the stack parallel to the stacking direction S are coated with a layer of ceramic-type material, preferably glass, ceramic, etc., (step C) either completely or just within the subsequent sections I, II, III. The material for this coating is selected so that it has an extension capacity that corresponds approximately to the piezoceramic multilayer actuator 1. The stack is then sintered in step E.

It is likewise preferred for the insulation layer 40 to be applied after sintering (E) and to be burned in using an appropriate heat treatment (step F). This method route is shown with a broken line in FIG. 3. For step F it is also possible to coat the sintered multilayer actuator with plastic or a polymer to form the insulation layer 40. It is sufficient for the materials of the insulation layer if they have an extension capacity of approximately 0.5%, in order to be able to track the movements of the sections I, II, III of the multilayer actuator 1 without damage. It is also advantageous if they have a lower modulus of elasticity than the multilayer actuator and/or a thermal expansion coefficient corresponding approximately to that of the multilayer actuator.

To produce the piezoceramic multilayer actuator 1 according to the embodiment in FIG. 2A electrodes 20 are applied, for example printed onto, green films in step B, their area being smaller than that of the subsequent adjacent piezoceramic layer 10. If these piezoceramic layers and electrodes are combined to form a stack, the piezoelectrically inactive peripheral region forming the insulation layer 50 results in sintering (E).

The invention claimed is:

1. A piezoceramic multilayer actuator, comprising:
    a plurality of piezoceramic layers and a plurality of electrodes, which are disposed one above the other in a stacking direction such that the electrodes are located on opposing sides of the piezoceramic layers,
    at least one micromechanical relief zone, within which mechanical stresses in the piezoceramic multilayer actuator can be reduced, wherein
    a number of sections of the piezoceramic multilayer actuator without a micromechanical relief zone have an insulation layer, so that the section of the piezoceramic multilayer actuator is at least one of electrically, chemically and thermally insulated from a medium surrounding the piezoceramic multilayer actuator.

2. The piezoceramic multilayer actuator according to claim 1, wherein the insulation layer only extends over sections of the piezoceramic multilayer actuator without a micromechanical relief zone.

3. The piezoceramic multilayer actuator according to claim 1, wherein the insulation layer is a passivation layer, which can be applied before a multilayer actuator green body is sintered or the piezoceramic multilayer actuator is heat-treated.

4. The piezoceramic multilayer actuator according to claim 3, wherein the insulation layer consists of glass, ceramic or a sinterable material, at least one of the extensibility and thermal expansion coefficient of which corresponds approximately to that of the piezoceramic multilayer actuator.

5. The piezoceramic multilayer actuator according to claim 1, wherein the insulation layer is a passivation layer, which can be applied after the piezoceramic multilayer actuator has been sintered.

6. The piezoceramic multilayer actuator according to claim 5, wherein the insulation layer consists of a plastic or polymer.

7. The piezoceramic multilayer actuator according to claim 1, having a piezoelectrically inactive region adjacent to a surrounding medium to form the insulation layer.

8. The piezoceramic multilayer actuator according to claim 7, wherein the electrodes are each configured with a smaller surface than the piezoceramic layers so that the piezoceramic layers each have a piezoelectrically inactive peripheral region.

9. A piezoceramic multilayer actuator according to claim 7, wherein each electrode has a contacting section, which leads to an outer edge of a piezoceramic layer, so that the electrodes can be contacted electrically from outside the piezoceramic multilayer actuator.

10. A production method for a piezoceramic multilayer actuator, comprising the following steps:
    provision of a number of piezoceramic green films and application of electrodes to at least one side of the piezoceramic green film,
    arrangement of the piezoceramic green films with electrodes one above the other in a stacking direction to form a stack and sintering of the stack, while at least one material layer is disposed within the stack, which forms a micromechanical relief zone after sintering, and
    production of an insulation layer adjacent to a medium surrounding the piezoceramic multilayer actuator in sections of the piezoceramic multilayer actuator without a micromechanical relief zone, so that the piezoceramic multilayer actuator is at least one of electrically, chemically and thermally insulated from the outside.

11. The production method according to claim 10, wherein after sintering in a section of the piezoceramic multilayer actuator that contains no micromechanical relief zone, an insulation layer is applied to an outer surface of the piezoceramic multilayer actuator parallel to the stacking direction.

12. The production method according to claim 10, wherein before sintering in a section of the piezoceramic multilayer actuator that contains no micromechanical relief zone after sintering, a layer is applied to an outer surface of the piezoceramic multilayer actuator parallel to the stacking direction, from which a passivation layer is formed when the piezoceramic multilayer actuator is sintered or heat-treated.

13. The production method according to claim 12, the passivation layer consists of glass, ceramic or a material that has at least one of an extension capacity and thermal expansion coefficient that corresponds approximately to the piezoceramic multilayer actuator.

14. The production method according to claim 10, wherein the insulation layer is formed by forming inactive regions in a peripheral region of the piezoceramic multilayer actuator parallel to the stacking direction, in such a manner that a surface of the electrodes is configured smaller than a surface of the adjacent piezoceramic green films.

15. The production method according to claim 14, wherein each electrode has a contacting section, which leads to an outer edge of a piezoceramic layer, so that the electrodes can be contacted electrically from outside the piezoceramic multilayer actuator.

16. The production method according to claim 10, wherein before sintering in a section of the piezoceramic multilayer actuator that contains no micromechanical relief zone after sintering, a ceramic-type layer is applied to an outer surface of the piezoceramic multilayer actuator parallel to the stacking direction, from which a passivation layer is formed when the piezoceramic multilayer actuator is sintered or heat-treated.

17. The production method according to claim 10, wherein the insulation layer is a passivation layer, which can be applied before a multilayer actuator green body is sintered or the piezoceramic multilayer actuator is heat-treated.

18. The production method according to claim 17, wherein the passivation layer consists of plastic or a polymer.

19. The production method according to claim 10, wherein the insulation layer is a passivation layer, which can be applied after the piezoceramic multilayer actuator has been sintered.

20. The production method according to claim 19, the insulation layer consists of a plastic or polymer.

* * * * *